(12) United States Patent
Makihata et al.

(10) Patent No.: US 7,590,252 B2
(45) Date of Patent: Sep. 15, 2009

(54) HEAT-RESISTANT ELECTRET CONDENSER MICROPHONE

(75) Inventors: Katsuhiro Makihata, Kanagawa (JP); Hiroshi Ogura, Tokyo (JP); Yoshinobu Yasuno, Kanagawa (JP)

(73) Assignee: Panasonic Corporation, Osaka (JP)

( * ) Notice: Subject to any disclaimer, the term of this patent is extended or adjusted under 35 U.S.C. 154(b) by 276 days.

(21) Appl. No.: 10/589,281

(22) PCT Filed: Aug. 4, 2005

(86) PCT No.: PCT/JP2005/014333

§ 371 (c)(1),
(2), (4) Date: Aug. 11, 2006

(87) PCT Pub. No.: WO2006/013940

PCT Pub. Date: Feb. 9, 2006

(65) Prior Publication Data

US 2007/0160247 A1    Jul. 12, 2007

(30) Foreign Application Priority Data

Aug. 6, 2004    (JP)    ............................. 2004-230407

(51) Int. Cl.
*H04R 25/00*    (2006.01)
(52) U.S. Cl. .................... 381/174; 381/91; 381/178; 381/369
(58) Field of Classification Search .................. 381/174, 381/178, 355, 369, 91; 181/158; 29/594
See application file for complete search history.

(56) References Cited

U.S. PATENT DOCUMENTS

| | | | | |
|---|---|---|---|---|
| 3,946,422 A | * | 3/1976 | Yagi et al. | .................. 381/191 |
| 6,818,092 B2 | | 11/2004 | Cho et al. | |
| 2003/0076970 A1 | * | 4/2003 | van Halteren et al. | ....... 381/369 |
| 2003/0113546 A1 | * | 6/2003 | Cho et al. | .................... 428/421 |
| 2006/0188728 A1 | * | 8/2006 | Kawato et al. | .............. 428/422 |
| 2006/0280320 A1 | * | 12/2006 | Song et al. | ................... 381/174 |

FOREIGN PATENT DOCUMENTS

| | | |
|---|---|---|
| JP | 9-283373 A | 10/1997 |
| JP | 2002-95093 A | 3/2002 |
| JP | 2002-125297 A | 4/2002 |
| JP | 2003-199197 A | 7/2003 |
| JP | 2003-259493 A | 9/2003 |
| JP | 2004-166262 A | 6/2004 |

* cited by examiner

*Primary Examiner*—Curtis Kuntz
*Assistant Examiner*—Jesse A Elbin
(74) *Attorney, Agent, or Firm*—McDermott Will & Emery LLP

(57) ABSTRACT

The outer face of a case which accommodates a whole microphone is coated by a material having a heat conductivity which is lower than that of a metal, and a material transforming temperature which is higher than the charge dissipating temperature of a dielectric layer for forming an internal electret, and which is higher than 260° C., so that the internal temperature rise can be mitigated by the thermal resistance and the thermal capacity of the whole interior. When a microphone is attached to an application equipment, particularly, the microphone may be passed through a reflow solder bath for a short time period. A heat-resistant structure which can prevent the function from being impaired by a high temperature in the period is provided.

12 Claims, 9 Drawing Sheets

HEAT-RESISTANT ELECTRET CONDENSER MICROPHONE

RELATED APPLICATIONS

This application is the U.S. National Phase under 35 U.S.C. § 371 of International Application No. PCT/JP2005/014333, filed on Aug. 4, 2005, which in turn claims the benefit of Japanese Application No. 2004-230407, filed on Aug. 6, 2004, the disclosures of which Applications are incorporated by reference herein.

TECHNICAL FIELD

The present invention relates to an electret condenser microphone which is mounted on an information communication equipment such as a cellular phone.

BACKGROUND ART

An electret condenser microphone was developed more than 30 years ago, and is still widely used as a component of a cellular phone and the like.

FIG. 8 is a diagram showing the basic structure of an electret condenser microphone. Referring to FIG. 8, a protective cloth 101 is a cloth which is placed for the purpose of preventing dust or the like from entering, and which is configured by a cloth having a high sound transmission property, such as nonwoven cloth. As a fixed electrode 102, used is a metal electrode or an electrode in which a face opposed to a vibrating diaphragm is electroconductive-treated. An electret film 103 is a dielectric film which is disposed on the fixed electrode 102, and generally used by applying FEP (tetrafluoroethylene-hexafluoropropylene) to the fixed electrode 102 by means of thermal fusion. A thin metal film or a plastic film in which one face is electroconductive-treated is used as the vibrating diaphragm 104. The vibrating diaphragm is bonded to a vibrating diaphragm support ring 105. A spacer 106 is disposed so that the vibrating diaphragm and the fixed electrode form and hold a predetermined positional relationship. Circuit components 107 are configured by an FET, a resistor, etc. On a circuit board 108, the circuit components 107 are mounted by soldering or the like, and form a preamplifier which converts a change of an electrostatic capacitance between the vibrating diaphragm and the fixed electrode due to vibration displacement, to an electric signal, and a terminal board and a bottom face plate are configured. A spacer 109 is used for forming a desired space between the fixed electrode 102 and the circuit board 108. As a case 110, used is a metal such as aluminum, or a molded plastic which is electroconductive-treated. A lower end portion of the case is subjected to a caulking process, bonding, or the like, and the case forms a housing and functions also as a shield case.

The electret condenser microphone basically operates so that an electric potential is produced between the vibrating diaphragm and the fixed electrode, and a displacement of the vibrating diaphragm due to a sound pressure is taken out as an electric output. When charges are produced in an electret layer, a high potential (several tens of volts) can be held between the vibrating diaphragm and the fixed electrode, and a displacement of the vibrating diaphragm due to a sound pressure can be taken out as a large electric output.

Conventionally, an electret condenser microphone has been mounted as an attachment component via a connector or the like on a board mounted in a cellular phone or the like. Recently, a microphone itself must be directly mounted on a board of a cellular phone or the like by using the solder reflow method.

As shown in Patent Reference 1, recently, also a parallel-plate condenser microphone which is produced by using the micromachining technique so as to cope with Pb-free reflow has been proposed.

Patent Reference 1: JP-A-2002-95093

However, it is known that electreted FEP has characteristics that charges easily escape as result of heating.

FIG. 9 shows a temperature profile of reflow which is used in direct mounting on a board of a cellular phone or the like. Recently, Pb-free reflow (reflow using a solder material which does not contain Pb) is desired. FIG. 9 shows a temperature profile of typical Pb-free reflow. In Pb-free reflow, heating for about 10 to 30 sec. is performed at 260 deg. Therefore, a component to be reflowed is required to have thermal resistance which can endure such heating.

However, a usual electret condenser microphone does not have thermal resistance against the Pb-free reflow temperature. FIG. 10 shows experimental results in the case where a surface potential was measured when an electrode in which FEP (thickness: 25 μm) is formed as an electret was heated. In FIG. 10, the abscissa indicates the heating temperature (30 sec.), and the ordinate indicates the surface potential of the electret. FIG. 10 shows that the surface potential, which is −250 V at ordinary temperature, is reduced by about 20% at 200° C., and reduced or eliminated by about 90% at 300° C. The experimental results suggest that a usual ECM cannot cope with Pb-free reflow.

In an electret in which charges escape as result of heating, mounting to a cellular phone is hardly performed by reflow. Recently, as described above, also a parallel-plate condenser microphone which is produced by using the micromachining technique so as to cope with Pb-free reflow has been proposed.

However, a microphone which is produced by using micromachining has a problem in that the cost of the microphone itself is raised because the micromachining technique is a processing method which is expensive in the viewpoint of processing steps.

The invention has been conducted in view of the above-described circumstances. It is an object of the invention to provide an electret condenser microphone which can withstand a high temperature. When a microphone is attached to an application equipment, especially, the microphone may be passed through a reflow solder bath for a short time period. It is an object of the invention to provide a heat-resistant structure which can prevent the function from being impaired by a high temperature in the period.

DISCLOSURE OF THE INVENTION

In order to attain the objects, in the electret condenser microphone of the invention, an outer face of a case which accommodates the whole microphone is coated by a coating material having a low heat conductivity. Particularly, the thickness and heat conductivity of the coating material are adjusted so that, when the microphone is to be passed through a reflow solder bath, the microphone is passed through the solder bath before a dielectric layer for forming an electret reaches the charge dissipating temperature, whereby deterioration of the dielectric layer due to temperature rise is prevented from occurring. When the coating material is a material having a heat conductivity which is lower than that of a metal, and a material transforming temperature which is higher than the charge dissipating temperature of the dielectric layer for forming an electret, and which is higher than 260° C., the internal temperature rise can be mitigated by the thermal resistance and the thermal capacity of the whole interior.

A first electret condenser microphone of the invention has: a vibrating diaphragm in which one face is electrically conductive; a fixed electrode which is placed to be opposed to the vibrating diaphragm via an air layer; a dielectric layer which becomes an electret for storing charges in one of the vibrating diaphragm and the fixed electrode; circuit means for converting an electrostatic capacity between the vibrating diaphragm and the fixed electrode to an electric signal; external connecting means for leading out the electric signal; and a spacer which forms and holds a predetermined positional relationship between the vibrating diaphragm and the fixed electrode, and which forms a space between the fixed electrode and the circuit means, the microphone being incorporated in a metallic case while exposing only the external connecting means, and is characterized in that an outer face of the case is coated by a nonmetallic material in which a deforming temperature is higher than a charge dissipating temperature of the dielectric layer that becomes the electret.

A second electret condenser microphone of the invention is characterized in that the nonmetallic material which coats the case is one of polyimide, a liquid crystal polymer, polyetherimide (PEI), polyehteretherketone (PEEK), polyehternitrile (PEN), and polyphenylene sulfide (PPS), or a composite material containing one of the materials.

A third electret condenser microphone of the invention is characterized in that polytetrafloroethylene (PTFE) is used as a dielectric material for forming the electret.

A fourth electret condenser microphone of the invention is characterized in that a film thickness of polytetrafloroethylene (PTFE) is equal to or larger than three times of a particle diameter of the PTFE.

A fifth electret condenser microphone of the invention is characterized in that the microphone has a structure in which a silicon oxide film ($SiO_2$) is used as a dielectric material for forming the electret, and the silicon oxide film ($SiO_2$) is thoroughly coated by an insulator other than a silicon oxide film to prevent the silicon oxide film ($SiO_2$) from being exposed to an atmosphere.

A sixth electret condenser microphone of the invention is characterized in that the silicon oxide film ($SiO_2$) is formed by plasma CVD (Chemical Vapor Deposition) or low-pressure CVD.

A seventh electret condenser microphone of the invention is characterized in that a material of the spacer is one of polyimide, a liquid crystal polymer, polyetherimide (PEI), polyehteretherketone (PEEK), polyehternitrile (PEN), and polyphenylene sulfide (PPS), or a composite material containing one of the materials.

EFFECTS OF THE INVENTION

The invention is applied to an electret condenser microphone which is often used in an information communication equipment, and can provide an electret condenser microphone in which the performances, particularly the thermal resistance performance are improved, restrictions on handling in attachment of the electret condenser microphone are mitigated, and the convenience is enhanced.

Figure 1:
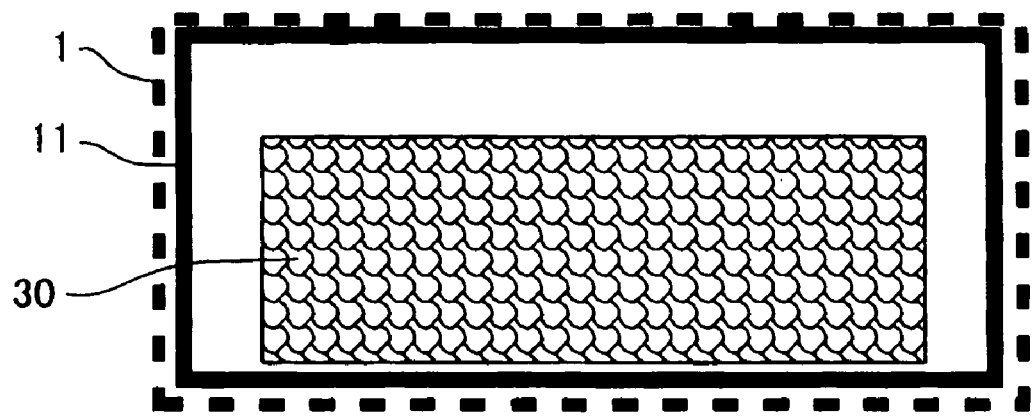
FIG. 1 is a diagram of a configuration showing the concept of the invention.

DESCRIPTION OF REFERENCE NUMERALS AND SIGNS 1 coating film coating a case
2 protective cloth
3 fixed electrode
4 electret film
5 vibrating diaphragm
6 vibrating diagram support ring
7 spacer
8 circuit component
9 circuit board
10 wiring pattern
11 case
12 spacer

BEST MODE FOR CARRYING OUT THE INVENTION

Hereinafter, embodiments of the invention will be described with reference to the drawings.

EMBODIMENT 1

Figure 2:
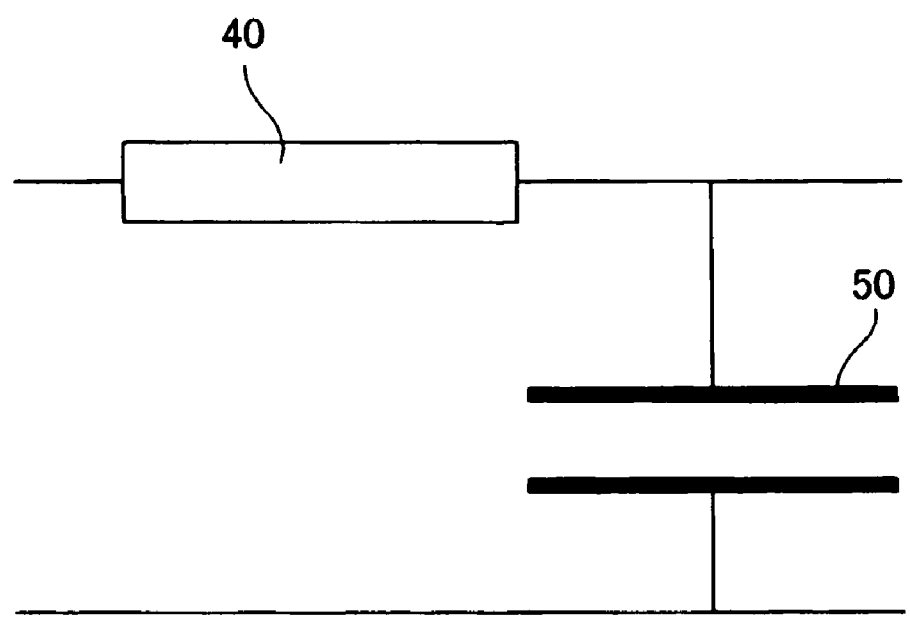
FIG. 2 is an electric equivalent circuit diagram showing the concept of the invention.
Figure 3:
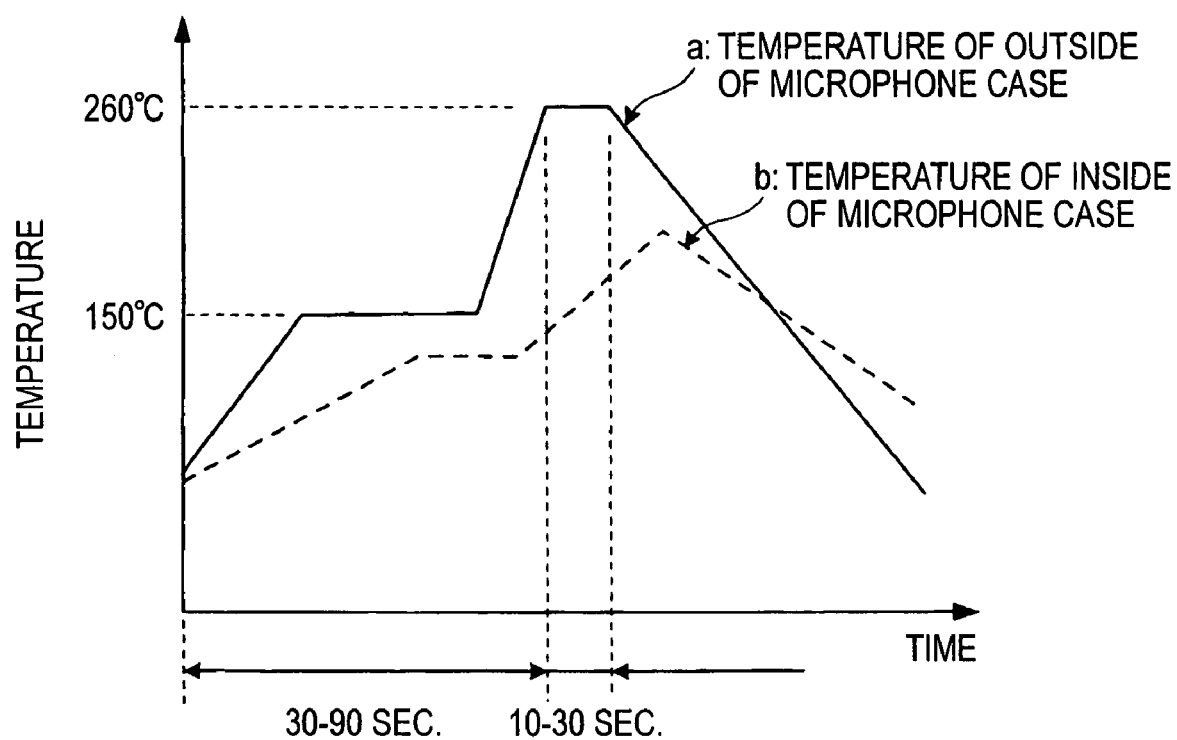
FIG. 3 is a view showing the temperature of the interior of a case of the electret condenser microphone of the invention.

FIGS. 1 and 2 are diagrams showing the concept of the invention. FIG. 1 schematically shows the configuration, and FIG. 2 shows FIG. 1 in the form of an electric equivalent circuit diagram. As shown in FIG. 1, an electret condenser microphone of Embodiment 1 is characterized in that, on the outer surface of a microphone case 11, polyimide that is a nonmetallic material in which the deforming temperature is higher than the charge dissipating temperature of the dielectric layer that becomes the electret, the thermal resistance is high, and the thermal capacity is large is used as coating 1 of the case, whereby the microphone is protected so that, when the microphone is passed through a reflow solder bath, the interior of the case, particularly, the dielectric layer does not reach the charge dissipating temperature. A group of components in the case is indicated by 30. Referring to FIG. 2, a resistor indicates 40, and a capacitor indicates 50. The left side of the resistor 40 corresponds to the input, i.e., the external temperature, and the right side of the capacitor 50 corresponds to the output, i.e., the internal temperature. From the electric equivalent circuit diagram shown in FIG. 2, it will be understood that the internal temperature rises more moderately as the thermal resistance is higher and the thermal capacity is larger. FIG. 3 shows relationships between the temperature rise of the interior of the case of the electret condenser microphone having the configuration of FIG. 1, and the external temperature. The abscissa indicates the time, and the ordinate indicates the temperature. A curve showing the external temperature of the microphone case is a, and the internal temperature of the microphone case is b.

In the configuration of FIG. 1, when the external temperature rises or lowers, the heat conduction to the case 11 is delayed by the coating 1 which is applied to the surface of the case, and which has a high thermal resistance (the heat conductivity is low), and the temperature rise is delayed because of the existence of the thermal capacity of the whole interior. By contrast, as indicated by the temperature profile of solder reflow shown in FIG. 9, with respect to the external temperature, the holding time of a high temperature (260° C.) is as short as 10 to 30 sec. Before the thermal balance between the interior and the exterior is attained, therefore, the external temperature lowers, and therefore the internal temperature does not rise to a high temperature (260° C.). This phenomenon will be considered with using the electric equivalent circuit diagram shown in FIG. 2. The resistor 40 indicates the thermal resistance due to the coating 1, and the capacitor 50 indicates the thermal capacity of the whole interior including the case 11. The equivalent circuit diagram itself shown in FIG. 2 serves as a delay circuit for conduction of heat from the outside. It can be ascertained that, if the period when the external temperature is high is short, the temperature of the interior of the case does not rise to a level of the external temperature.

As described above, if the performance of the microphone itself is not largely deteriorated when charges of the electret do not escape at the highest temperature of the temperature curve b of the case interior shown in FIG. 3, or even when charges slightly escape, it is possible to realize an electret condenser microphone which has thermal resistance against Pb-free reflow.

Hereinafter, a specific embodiment will be described.

Figure 4:
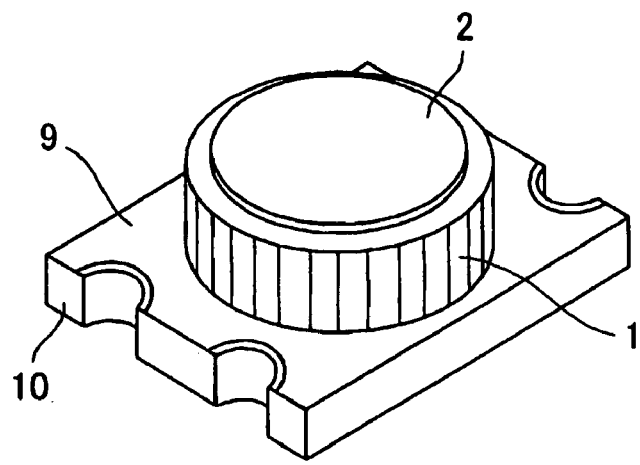
FIG. 4 is a view showing the configuration of the electret condenser microphone of the invention.
Figure 4:
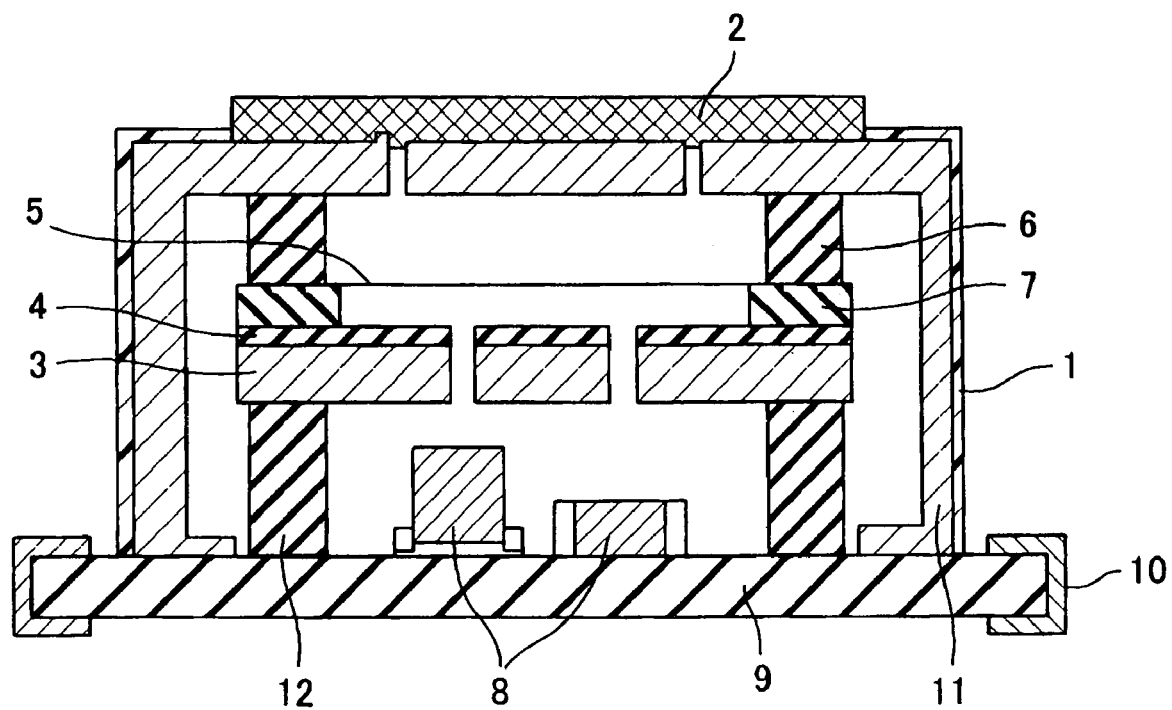

FIG. 4 is a view showing an embodiment of the invention, (a) is a perspective view, and (b) is a section view. Referring to FIG. 4, the material of the coating film 1 which coats the case is polyimide. The electret condenser microphone of the embodiment has: an electret film 4 that is a vibrating diaphragm in which one face is electrically conductive; a fixed electrode 3 which is placed to be opposed to the electret film 4 via an air layer; a spacer 7 which is placed so as to form and hold a predetermined positional relationship between the electret film 4 and the fixed electrode 3; and a spacer 12 which forms a space between the fixed electrode 3 and a circuit board 9 constituting the circuit means. The microphone is incorporated in the metallic case 11 so that only a wiring pattern 10 serving as external connecting means is exposed. A protective cloth 2 is formed on the case 11 coated by the coating film 1 in this way, and the fixed electrode 3, the electret film 4, a vibrating diaphragm 5, a vibrating diaphragm support ring 6, the spacer 7, and circuit components 8 configured by an FET, a resistor, and the like are accommodated in the case, and fixed onto the circuit board 9. The wiring pattern which is disposed on the circuit board 9, and which is used for connecting with another board is 10, and connected with the other board by soldering in the reflow process. The spacer 12 forms a desired space between the fixed electrode 3 and the circuit board 9.

In the embodiment, the coating film 1 is polyimide. Other than polyimide, one of a liquid crystal polymer, polyetherimide (PEI), polyehteretherketone (PEEK), polyehternitrile (PEN), and polyphenylene sulfide (PPS), or a composite material may be used as a similar coating film because the deforming temperatures of the materials are higher than the charge dissipating temperature of the dielectric material constituting the dielectric layer for forming the internal electret.

These materials have a melting point which is higher than the temperature acting on the microphone in reflow, as shown by melting points in the table below. The maximum temperature in reflow is 260° C., and the holding time is 10 to 30 sec. When such a material is used, therefore, an effect that the structure of the microphone is not damaged is attained.

TABLE 1

| Material | Melting point |
|---|---|
| liquid polymer | 280° C. |
| polyimide | none (glass transition temp.: 315° C.) |
| PEI | 365° C. |
| PEEK | 334° C. |
| PEN | 262° C. |
| PPS | 278° C. |

A cloth having thermal resistance of 260° C. (for example, lanthanum nonwoven cloth produced by Asahi Kasei Kabushiki Kaisha) is applied as the protective cloth 2. The material of the fixed electrode 3 is stainless steel or brass. As the dielectric material constituting the electret film 4, FEP may be applied, but the use of PTFE is desirable. The reason of the above is that the thermal resistance of PTFE (melting point: 327° C., decomposition starting temperature: about 390° C.) is higher than that of FEP (melting point: 250 to 280° C., decomposition starting temperature: about 290° C.).

Figure 7:
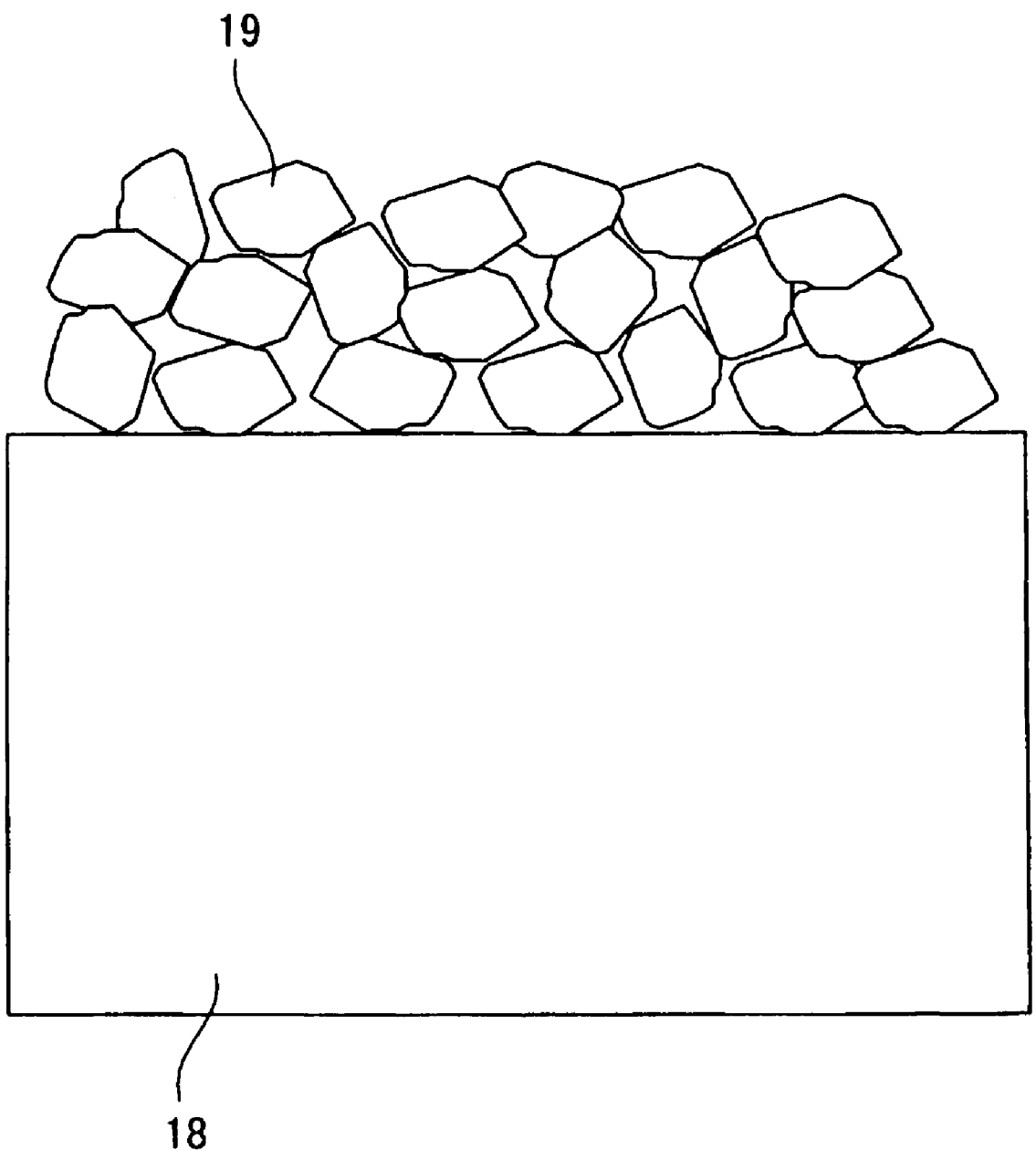
FIG. 7 is a diagram showing a coating film of PTFE in the invention.
Figure 8:
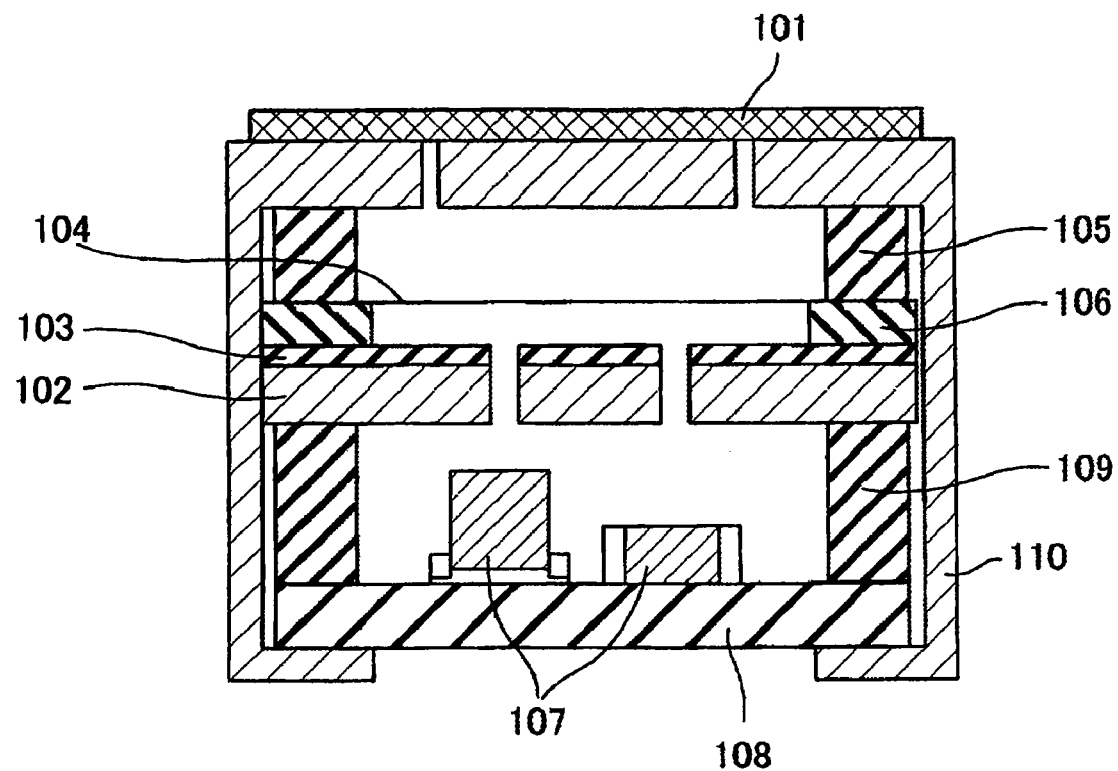
FIG. 8 is a diagram of a typical structure of an electret condenser microphone.

In order to form a film which is free from pinholes, and which has an excellent quality, desirably, the film thickness of PTFE is equal to or larger than three times of the particle diameter of the PTFE. FIG. 7 is a diagram illustrating the reason why the film thickness of PTFE is equal to or larger than three times of the particle diameter of the PTFE, and showing a state of a coating film of PTFE applied to a board. In FIG. 7, a substrate is 18, and particles of PTFE are 19. The PTFE film is sprayed to the substrate 18 by a spray gun or the like in a liquid state in which a binder and PTFE particles are mixed with each other, and is formed as a coating film. Thereafter, the binder is dried, and the PTFE film is formed. Usually, the median particle diameter of PTFE is 1 to 10 μm. In the case where the PTFE particles 19 exist in two layers (i.e., the thickness of the electret film is two times of the particle diameter of PTFE) on the substrate 18, gaps are produced between particles of PTFE, and the PTFE film is a film in which pinholes exist.

By contrast, in the case where the PTFE particles 19 exist in three layers (i.e., the thickness of the electret film is three times of the particle diameter of PTFE), the PTFE particles 19 are in contact with each other, and the PTFE film can be formed as a film which is free from pinholes. The material of the vibrating diaphragm 5 is a titanium (Ti) foil, and the thickness is 2 μm. As the material of the vibrating diaphragm support ring 6, titanium is desirably used. Since titanium is a material which is hardly processed, however, stainless steel may be selected, and the vibrating diaphragm 5 and the vibrating diaphragm support ring 6 may be bonded together by using a thermoplastic conductive resin. When a thermoplastic conductive resin is heated, the resin exhibits a fluidity. Therefore, a configuration in which, when the microphone case body is heated, the difference in thermal expansion between the vibrating diaphragm 5 and the vibrating diaphragm support ring 6 is absorbed is possible.

The materials of the spacer 7 and the spacer 12 are polyimide. Because of the same reason as the selection of the material of the coating film, one of a liquid crystal polymer, polyetherimide (PEI), polyehteretherketone (PEEK), polyehternitrile (PEN), and polyphenylene sulfide (PPS), or a composite material may be used. The material of the case 11 is aluminum, but not restricted to aluminum. The material may be another material such as alloy of nickel, zinc and cupper or stainless steel. The bottom face of the case 11 is bonded to the circuit board 9 by a thermoplastic conductive resin.

Figure 9:
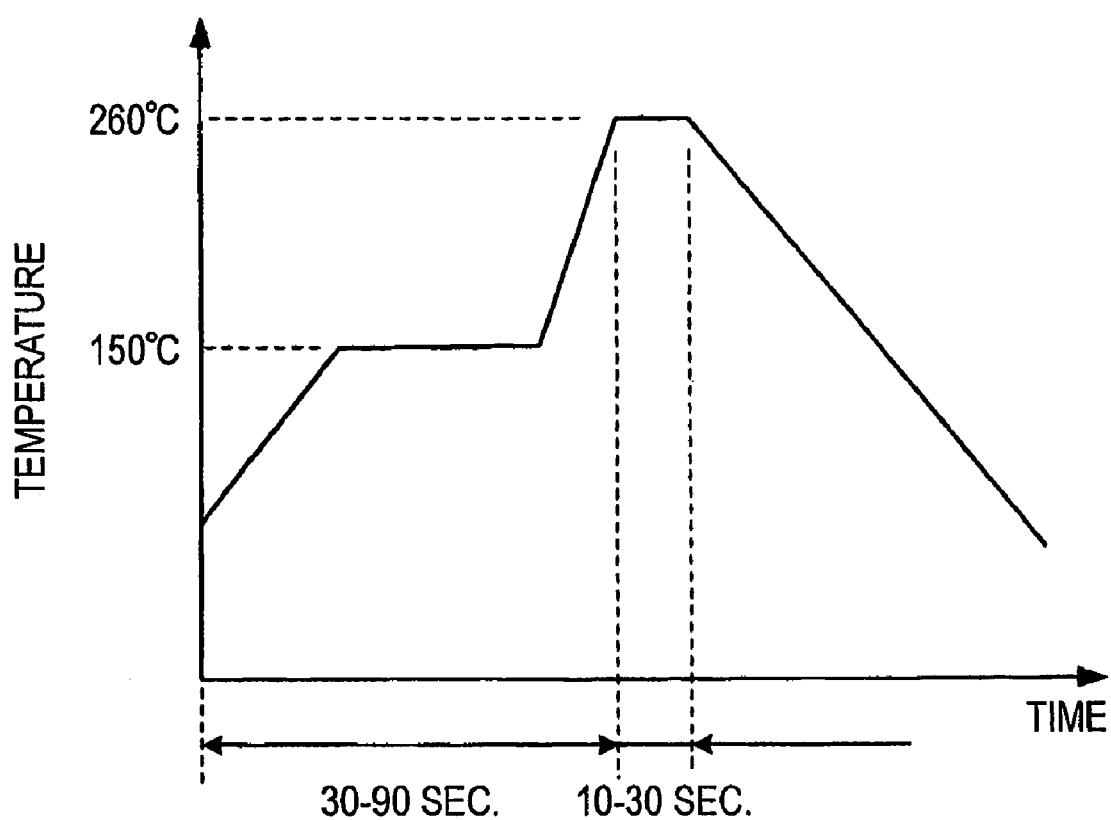
FIG. 9 is a view showing a profile of Pb-free reflow.
Figure 10:
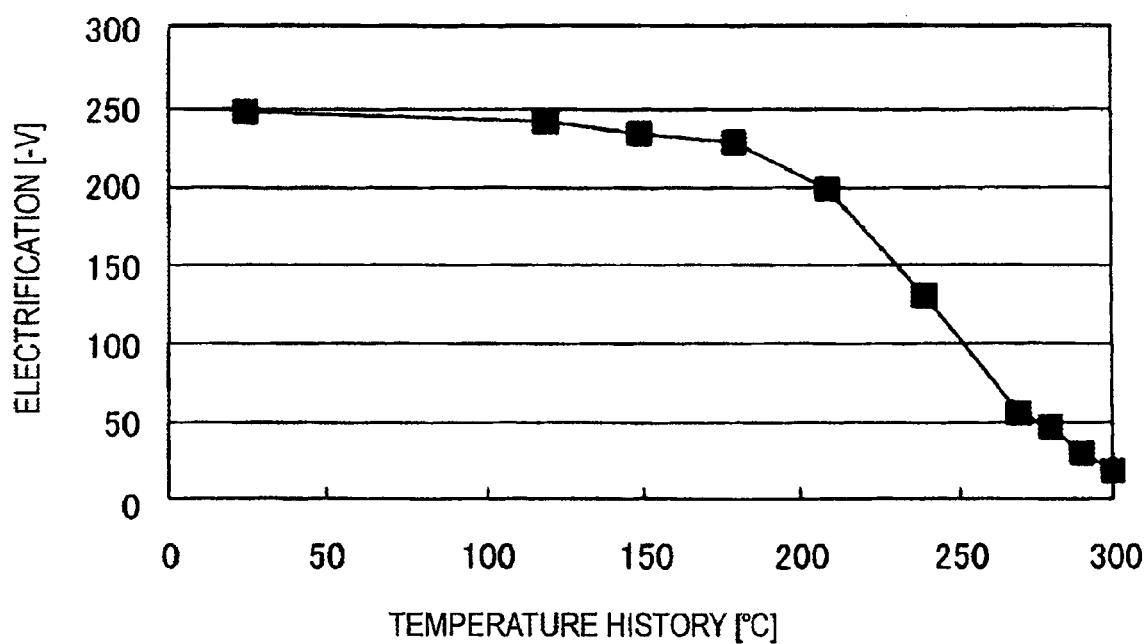
FIG. 10 is a view showing deterioration of electrification due to heating of the electret.

That is, the electret condenser microphone was configured as shown in FIG. 4, soldering was performed in the reflow temperature profile shown in FIG. 9, and the sensitivity characteristic was checked. It was found that the characteristic suffers no influence and the normal characteristic is maintained. This result indicates that a heat-resistant electret condenser microphone is realized.

The invention intends that, in a shirt-time high-temperature environment which is imposed when the materials assembling a microphone is passed through a solder reflow step, conduction of heat into the interior is delayed and the temperature rise is suppressed by the effect of the thermal capacity of the interior. The invention does not cope with the case where the thermal balance between the interior and the exterior is attained under a long-time high-temperature environment. From the view point of thermal resistance against a Pb-free reflow step, however, the invention can sufficiently achieve the objects. As compared with the case where a microphone is produced by using the micromachining technique, the invention has an effect that a microphone can be realized simply by slightly changing the conventional microphone production steps, and therefore is superior in economic efficiency (production cost of a microphone).

EMBODIMENT 2

A second embodiment of the invention will be described.

In Embodiment 1, the example in which PTFE is used as the electret film has been described. When a silicon oxide film ($SiO_2$) is used in place of PTFE, it is possible to attain the same effects.

Figure 5:
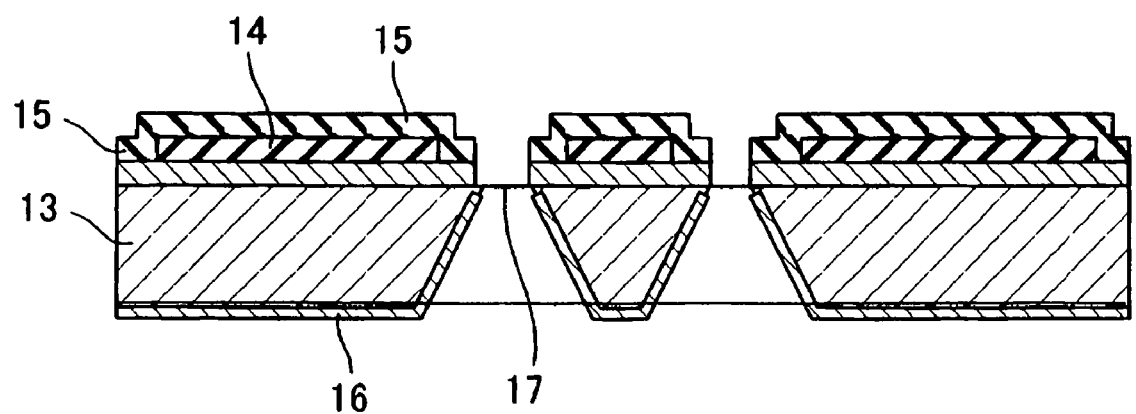
FIG. 5 is a view showing an electret in the invention.

FIG. 5 is a view showing an electrode structure in which a silicon oxide film is used as an electret film. The case and other peripheral components are formed in the same manner as those of Embodiment 1. In the embodiment, the vibrating diaphragm comprises: a silicon substrate 13; a silicon oxide film 14 which functions as an electret; a silicon nitride film 15 which coats the periphery of the silicon oxide film; a metal film 16 which is formed on the rear face of the silicon substrate 13; and vacant holes 17 which are disposed in the silicon substrate 13.

Desirably, the silicon oxide film 14 is formed by the plasma CVD method or the low-pressure CVD method. The reason of this is that the temperature in film growth can be set to be 300° C. or more. When the formation is performed at a film growth temperature of 300° C. or more, it is possible to prevent unwanted elements (for example, H and N) from entering the film. The silicon oxide film may be grown by sputtering by 300° C. or more. In sputtering, however, the composition of the silicon oxide film is $Si_xO_y$, and less apt to be $SiO_2$. The vacant holes 17 are formed by using wet etching or dry etching. The embodiment is characterized in that the silicon oxide film 14 is thoroughly coated by another insulating film (in the example, the silicon nitride film 15). A silicon oxide film has the property that, when it is in contact with atmospheric air, it adsorbs atmospheric moisture. However, an electret film (including not only a silicon oxide film, but also other electret films such as FEP) has the characteristic that, when moisture adheres, charges of the electret escape. When an electreted silicon oxide film is exposed for a long time, therefore, the silicon oxide film adsorbs atmospheric moisture, and the characteristic as an electret film is deteriorated. In the invention, consequently, the silicon oxide film ($SiO_2$) is thoroughly coated by an insulator other than a silicon oxide film to prevent the silicon oxide film ($SiO_2$) from being exposed to the atmosphere, thereby preventing the characteristic of an electret film form being deteriorated.

According to experiments conducted by the inventor, in the case of a structure in which a silicon oxide film is formed as an electret while being exposed, electrified charges escaped for several hours to several tens of hours even when the structure was allowed to stand at ordinary temperature. However, it was found that deterioration of electrification can be prevented from occurring by thoroughly coating a silicon oxide film by another insulating film (in the example, the silicon nitride film 15).

Figure 6:
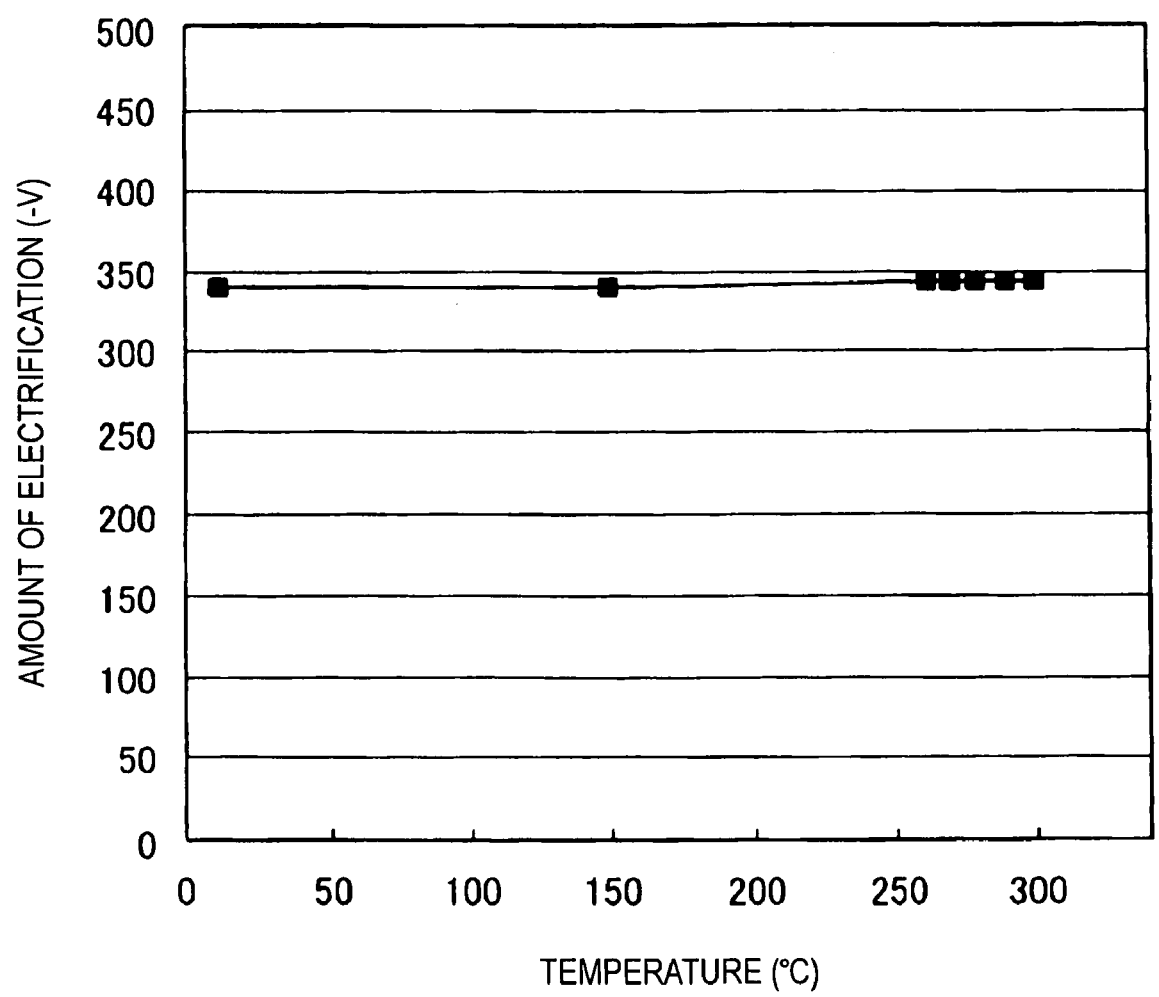
FIG. 6 is a view showing experimental results indicating an effect of the invention.

FIG. 6 is a view showing results of the electrification characteristic when, in the structure shown in FIG. 5, a silicon oxide film of 600 nm which was formed by the low-pressure CVD is thoroughly coated by a silicon nitride film which was formed by the low-pressure CVD. The silicon nitride film was formed so as to have a thickness of 200 nm on the bottom face of the silicon oxide film, and that of 200 nm on the upper face. The metal film 16 which is configured by a two-layer film of titanium (Ti: thickness=50 nm) and gold (Au: thickness=150 nm) was formed on the rear face of the silicon substrate. In the experiments, formed samples were heated for 30 sec. to 150° C., 260° C., 270° C., 280° C., 290° C., and 300° C., respectively, and the surface potentials were measured. Experimental results show that the electrification potential of the electret of the silicon oxide film was not deteriorated by heating. It is estimated that, when the silicon oxide film 14 is thoroughly coated by the silicon nitride film 15, the silicon nitride film functions as a barrier to prevent adsorption of moisture and deterioration of electrification from occurring.

When a fixed electrode with an electret film having the structure of the embodiment is applied to the electret condenser microphone of Embodiment 1, it is possible to produce a heat-resistant electret condenser microphone which can cope with Pb-free reflow.

INDUSTRIAL APPLICABILITY

According to the configuration of the electret condenser microphone of the invention, it is possible to produce a heat-resistant electret condenser microphone which is superior in economic efficiency, and which can be surface-mounted. Therefore, the configuration is effective in production of a circuit board for a cellular phone or vehicle mounting.

The invention claimed is:

1. An electret condenser microphone comprising:
   a vibrating diaphragm in which one face is electrically conductive;
   a fixed electrode which is placed to be opposed to said vibrating diaphragm via an air layer;
   a dielectric layer which becomes an electret for storing charges in one of said vibrating diaphragm and said fixed electrode;
   circuit means for converting an electrostatic capacity between said vibrating diaphragm and said fixed electrode to an electric signal;
   external connecting means for leading out the electric signal; and
   a first spacer which forms and holds a predetermined positional relationship between said vibrating diaphragm and said fixed electrode, said microphone being incorporated in a metallic case while exposing said external connecting means, wherein an outer face of said case is coated by a nonmetallic material in which a deforming temperature is higher than a charge dissipating temperature of said dielectric layer that becomes said electret.

2. The electret condenser microphone according to claim 1, wherein
said nonmetallic material which coats said case is one of polyimide, a liquid crystal polymer, polyetherimide (PEI), polyehteretherketone (PEEK), polyehternitrile (PEN), and polyphenylene sulfide (PPS), or a composite material containing one of the materials.

3. The electret condenser microphone according to claim 1, wherein said dielectric layer contains polytetrafloroethylene (PTFE).

4. The electret condenser microphone according to claim 3, wherein a film thickness of the polytetrafloroethylene (PTFE) is equal to or larger than three times of a particle diameter of the PTFE.

5. The electret condenser microphone according to claim 1, wherein said microphone has a structure in which said dielectric layer is a silicon oxide film, and said silicon oxide film is thoroughly coated by an insulator other than a silicon oxide film to prevent said silicon oxide film from being exposed to an atmosphere.

6. The electret condenser microphone according to claim 5, wherein said silicon oxide film is formed by a plasma CVD (Chemical Vapor Deposition) method or a low-pressure CVD method.

7. The electret condenser microphone according to claim 5, wherein said silicon oxide film is a silicon dioxide film.

8. The electret condenser microphone according to claim 6, wherein said silicon oxide film is a silicon dioxide film.

9. The electret condenser microphone according to claim 1, wherein a material of said first spacer is one of polyimide, a liquid crystal polymer, polyetherimide (PEI), polyehteretherketone (PEEK), polyehternitrile (PEN), and polyphenylene sulfide (PPS), or a composite material containing one of the materials.

10. The electret condenser microphone according to claim 1, further comprising a second spacer which forms a space between said fixed electrode and said circuit means.

11. The electret condenser microphone according to claim 10, wherein a material of said second spacer is one of polyimide, a liquid crystal polymer, polyetherimide (PEI), polyehteretherketone (PEEK), polyehternitrile (PEN), and polyphenylene sulfide (PPS), or a composite material containing one of the materials.

12. The electret condenser microphone according to claim 10, wherein a material of said first and second spacer is one of polyimide, a liquid crystal polymer, polyetherimide (PEI), polyetheretherketone (PEEK), polyehternitrile (PEN), and polyphenylene sulfide (PPS), or a composite material containing one of the materials.

* * * * *